United States Patent
Kim et al.

(10) Patent No.: US 10,388,537 B2
(45) Date of Patent: Aug. 20, 2019

(54) CLEANING APPARATUS, CHEMICAL MECHANICAL POLISHING SYSTEM INCLUDING THE SAME, CLEANING METHOD AFTER CHEMICAL MECHANICAL POLISHING, AND METHOD OF MANUFACTURING SEMICONDUCTOR DEVICE INCLUDING THE SAME

(71) Applicant: Samsung Electronics Co., Ltd., Suwon-si (KR)

(72) Inventors: Chae Lyoung Kim, Hwaseong-si (KR); Tae-Hong Kim, Seoul (KR); Jung-Min Oh, Incheon (KR); Yungjun Kim, Seoul (KR); Ingi Kim, Hwaseong-si (KR); Boun Yoon, Seoul (KR); Hyosan Lee, Hwaseong-si (KR); Sol Han, Gyeonggi-do (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/428,963

(22) Filed: Feb. 9, 2017

(65) Prior Publication Data
US 2017/0301553 A1    Oct. 19, 2017

(30) Foreign Application Priority Data

Apr. 15, 2016 (KR) .......................... 10-2016-0045909
Jul. 25, 2016 (KR) .......................... 10-2016-0094385

(51) Int. Cl.
*B08B 3/02* (2006.01)
*H01L 21/306* (2006.01)
*B24B 37/20* (2012.01)
*B24B 53/017* (2012.01)
(Continued)

(52) U.S. Cl.
CPC ........ *H01L 21/30625* (2013.01); *B24B 37/20* (2013.01); *B24B 53/017* (2013.01); *H01L 21/02057* (2013.01); *H01L 21/02065* (2013.01); *H01L 21/02074* (2013.01);
(Continued)

(58) Field of Classification Search
None
See application file for complete search history.

(56) References Cited

U.S. PATENT DOCUMENTS

| 5,975,098 A | 11/1999 | Yoshitani et al. |
| 7,364,626 B2 | 4/2008 | Hirose et al. |
| 7,913,346 B2 | 3/2011 | Iwami et al. |

(Continued)

FOREIGN PATENT DOCUMENTS

| JP | 2008-108830 A | 5/2008 |
| JP | 5148156 B2 | 2/2013 |
| KR | 10-0591163 B1 | 6/2006 |

*Primary Examiner* — Shamim Ahmed
(74) *Attorney, Agent, or Firm* — Muir Patent Law, PLLC

(57) ABSTRACT

A cleaning apparatus for removing particles from a substrate is provided. The cleaning apparatus includes a first cleaning unit including a first dual nozzle supplying, to a substrate, a first chemical liquid and a first spray including a first liquid dissolving the first chemical liquid, and a second cleaning unit including a second dual nozzle supplying, to the substrate, a second chemical liquid different from the first chemical liquid and a second spray including a second liquid dissolving the second chemical liquid and being the same as the first liquid.

21 Claims, 11 Drawing Sheets

(51) Int. Cl.
*H01L 21/02* (2006.01)
*H01L 21/67* (2006.01)

(52) U.S. Cl.
CPC .. *H01L 21/67046* (2013.01); *H01L 21/67051* (2013.01); *H01L 21/67173* (2013.01); *H01L 21/67219* (2013.01)

(56) References Cited

U.S. PATENT DOCUMENTS

| | | | |
|---|---|---|---|
| 8,757,177 | B2 | 6/2014 | Kholodenko et al. |
| 9,048,269 | B2 | 6/2015 | Higashijima et al. |
| 9,142,399 | B2 | 9/2015 | Ishibashi |
| 9,595,434 | B2 | 3/2017 | Kim et al. |
| 2002/0005214 | A1* | 1/2002 | Tomita ............... B01F 3/0446 134/36 |
| 2004/0087158 | A1* | 5/2004 | Izumi ..................... B08B 3/02 438/689 |
| 2005/0158671 | A1* | 7/2005 | Shimizu ................ G03F 7/422 430/329 |
| 2007/0181153 | A1* | 8/2007 | Kobayashi ............. B08B 1/04 134/6 |
| 2008/0233753 | A1* | 9/2008 | Idani ................. H01L 21/02065 438/700 |
| 2008/0251107 | A1* | 10/2008 | Osada ............... H01L 21/67051 134/201 |
| 2011/0165823 | A1* | 7/2011 | Ide ......................... B24B 37/00 451/41 |
| 2012/0129346 | A1* | 5/2012 | Ryuzaki ............... B24B 37/044 438/693 |
| 2013/0061884 | A1* | 3/2013 | Yang ................. H01L 21/67051 134/26 |
| 2014/0190633 | A1 | 7/2014 | Maeda et al. |
| 2014/0373877 | A1 | 12/2014 | Inoue et al. |
| 2016/0027637 | A1 | 1/2016 | Kim et al. |
| 2016/0118275 | A1* | 4/2016 | Inoue ................. H01L 21/67051 134/56 R |

* cited by examiner

CLEANING APPARATUS, CHEMICAL MECHANICAL POLISHING SYSTEM INCLUDING THE SAME, CLEANING METHOD AFTER CHEMICAL MECHANICAL POLISHING, AND METHOD OF MANUFACTURING SEMICONDUCTOR DEVICE INCLUDING THE SAME

CROSS-REFERENCE TO RELATED APPLICATIONS

This application claims priority under 35 USC § 119 to Korean Patent Application No. 10-2016-0045909, filed on Apr. 15, 2016 and Korean Patent Application No. 10-2016-0094385, filed on Jul. 25, 2016, in the Korean Intellectual Property Office, the disclosures of which are incorporated herein in their entirety by reference.

BACKGROUND

Technical Field

Embodiments of the present disclosure relate to a substrate processing system and a substrate processing method thereof. For example, embodiments of the present disclosure relate to a cleaning apparatus for removing particles on a substrate, a chemical mechanical polishing system including the same, a cleaning method after chemical mechanical polishing, and a method of manufacturing a semiconductor device including the same.

Description of Related Art

A semiconductor device is manufactured by a plurality of unit processes. The plurality of unit processes include a thin film deposition process, a chemical mechanical polishing process, a photolithography process, an etch process, an ion implantation process and a cleaning process. The cleaning process is a unit process for removing particles on a substrate. The particles may be generated when performing the chemical mechanical polishing process, and thus the cleaning process may be performed after the chemical mechanical polishing process.

SUMMARY

Example embodiments of the inventive concepts may provide a cleaning apparatus with an improved cleaning efficiency and a cleaning method thereof after chemical mechanical polishing.

Example embodiments of the inventive concepts may provide a cleaning apparatus capable of reducing contamination of a brush and reverse contamination of a substrate caused by the contaminated brush and a cleaning method thereof after chemical mechanical polishing.

According to an example embodiment of the inventive concepts, a cleaning apparatus includes a first cleaning unit including a first dual nozzle configured to supply a first chemical liquid and a first spray to a substrate, the first spray including a first liquid for dissolving the first chemical liquid, and a second cleaning unit including a second dual nozzle configured to supply a second chemical liquid and a second spray to the substrate, the second chemical liquid being different from the first chemical liquid and the second spray including a second liquid for dissolving the second chemical liquid, the second liquid being the same as the first liquid.

According to an example embodiment of the inventive concepts, a chemical mechanical polishing system includes a substrate transfer apparatus configured to transfer a substrate, a polishing apparatus including a pad configured to polish the substrate, and a cleaning apparatus configured to clean the substrate polished by the pad to remove particles generated in the polishing apparatus. The cleaning apparatus includes a first cleaning unit including a first dual nozzle configured to supply, to the substrate, a first chemical liquid and a first spray including a first liquid for dissolving the first chemical liquid, and a second cleaning unit including a second dual nozzle configured to supply, to the substrate, a second chemical liquid different from the first chemical liquid and a second spray including a second liquid for dissolving the second chemical liquid, wherein the second liquid is the same as the first liquid.

According to an example embodiment of the inventive concepts, a cleaning method includes supplying, to a substrate, a first chemical liquid and a first spray including a first liquid dissolving the first chemical liquid, brushing a surface of the substrate and supplying a second chemical liquid different from the first chemical liquid onto the substrate, and supplying, to the substrate, a third chemical liquid being the same as the second chemical liquid and a second spray including a second liquid dissolving the third chemical liquid and being the same as the first liquid.

According to an example embodiment of the inventive concepts, a method of manufacturing a semiconductor device includes preparing a substrate, polishing the substrate, and cleaning the substrate to remove particles on the substrate after polishing the substrate. The cleaning of the substrate may include providing, to the substrate, a first chemical liquid and a first spray including a first liquid dissolving the first chemical liquid, brushing a surface of the substrate, and providing a second chemical liquid different from the first chemical liquid onto the substrate, and providing, to the substrate, a third chemical liquid being the same as the second chemical liquid and a second spray including a second liquid dissolving the third chemical liquid and being the same as the first liquid.

According to an example embodiment, a method of manufacturing a semiconductor device includes steps of forming a plurality of layers on a substrate, planarizing a surface of the substrate by a chemical mechanical polishing process, and cleaning the substrate with a cleaning apparatus, wherein the cleaning apparatus comprises a first part including a first dual nozzle, the first dual nozzle including a first spray nozzle and a first droplet nozzle, and a second part including a second dual nozzle, the second dual nozzle including a second spray nozzle and a second droplet nozzle, wherein the first spray nozzle provides a first liquid on the substrate while cleaning the substrate, wherein the first droplet nozzle provides a second liquid on the substrate while cleaning the substrate, wherein the second spray nozzle provides a third liquid on the substrate while cleaning the substrate, wherein the second droplet nozzle provides a fourth liquid on the substrate while cleaning the substrate, wherein the first liquid and second liquid are mixed to form a first solution while cleaning the substrate, and wherein the third liquid and fourth liquid are mixed to form a second solution while cleaning the substrate.

According to an exemplary embodiment, a method of manufacturing a semiconductor device includes steps of forming a plurality of layers on a substrate, planarizing a surface of the substrate by a chemical mechanical polishing process, providing a first liquid on the substrate from a center portion to an edge portion of the substrate, providing a second liquid on the substrate from the center portion to the edge portion of the substrate, providing a third liquid on the substrate from the center portion to the edge portion of the substrate, and providing a fourth liquid on the substrate from the center portion to the edge portion of the substrate, wherein providing the second liquid follows providing the first liquid, and the first and second liquids are mixed together on the substrate to form a first solution, wherein providing the fourth liquid follows providing the third liquid, and the third and fourth liquids are mixed together on the substrate to form a second solution, and wherein the second liquid is an acidic solution, and the fourth liquid is an alkaline solution.

DETAILED DESCRIPTION

Figure 1:
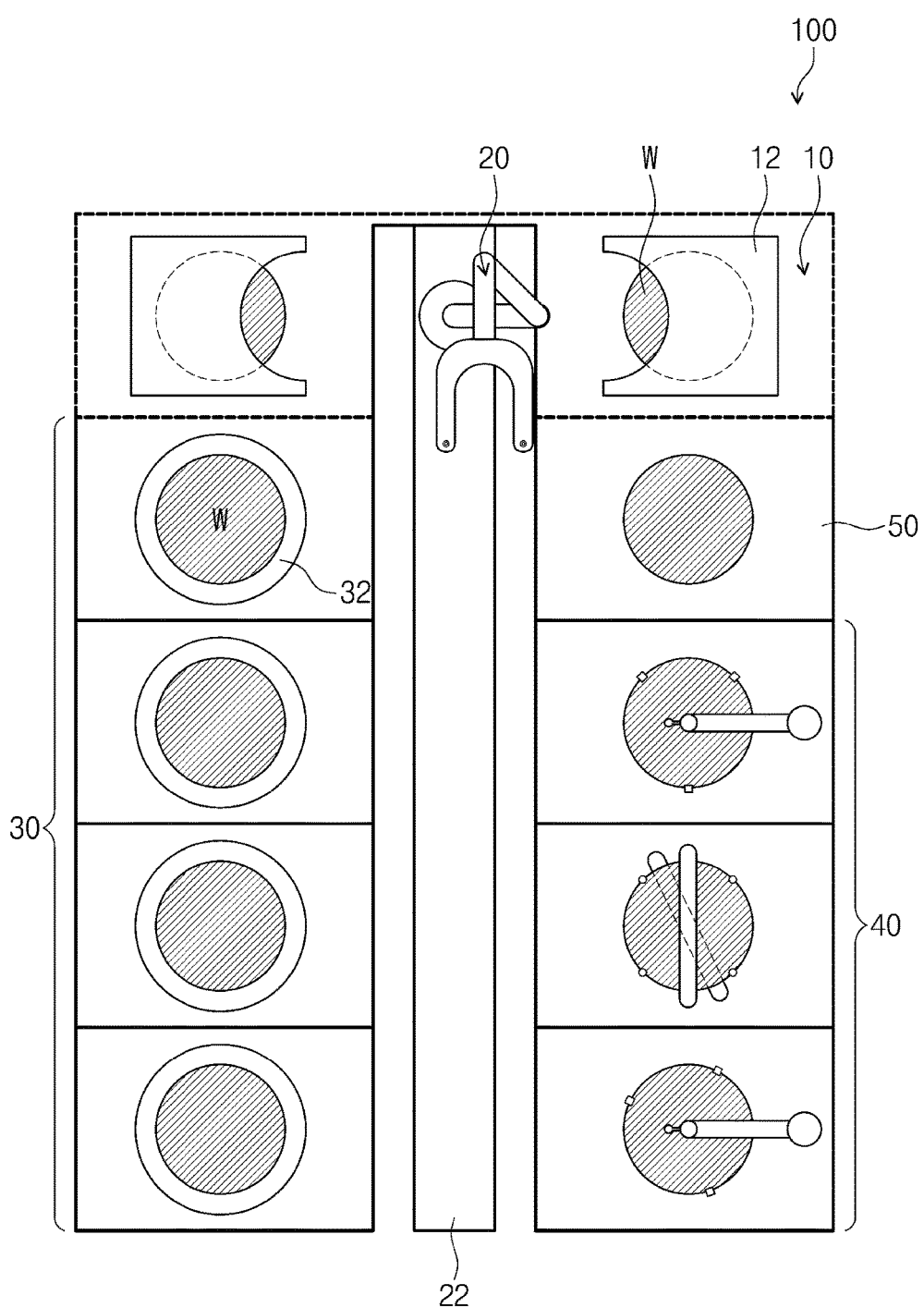
FIG. 1 illustrates a chemical mechanical polishing system according to example embodiments.

Hereinafter, example embodiments will be explained in detail with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

As used herein, the singular forms "a", "an" and "the" are intended to include the plural forms as well, unless the context clearly indicates otherwise. With the exception of "consisting of" and "essentially consisting of," it will be further understood that all transition terms describing elements of a step, component, device, etc., are open ended. Thus, unless otherwise specified (e.g., with language such as "only," "without," etc.), the terms "comprising," "including," "having," etc., may specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present. Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar,"

"coplanar," "cylindrical," "square," etc., as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill consistent with their meaning in the context of the relevant art and/or the present application.

FIG. 1 illustrates a chemical mechanical polishing system 100 according to example embodiments.

Referring to FIG. 1, a chemical mechanical polishing (CMP) system 100 may include a carrier loading apparatus 10, a substrate transfer apparatus 20, a polishing apparatus 30, a cleaning apparatus 40 and a drying apparatus 50. The carrier loading apparatus 10 may receive carriers 12. The substrate transfer apparatus 20 may transfer a substrate W accommodated in each of the carriers 12 to the polishing apparatus 30, the cleaning apparatus 40 and the drying apparatus 50. The substrate transfer apparatus 20 may include a robot arm moving along a guide rail 22. The guide rail 22 may be disposed between the polishing apparatus 30 and the cleaning apparatus 40. The polishing apparatus 30 may include a plurality of polishing pads 32. Each polishing pad 32 may be configured to polish the substrate W. The cleaning apparatus 40 may clean the polished substrate W. The drying apparatus 50 may dry the cleaned substrate W. The dried substrate W may be unloaded into the carriers 12 by the substrate transfer apparatus 20.

Figure 2:
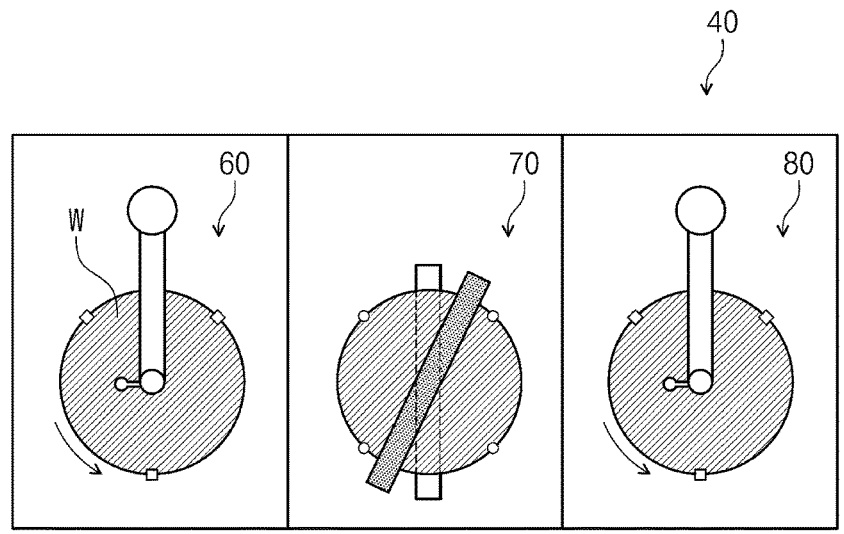
FIG. 2 is a plan view illustrating a cleaning apparatus of FIG. 1 according to example embodiments.

FIG. 2 is a plan view illustrating the cleaning apparatus 40 of FIG. 1 according to example embodiments.

Referring to FIGS. 1 and 2, the cleaning apparatus 40 may be a deionized-water-based cleaning apparatus. As an example, the cleaning apparatus 40 may include a first cleaning unit 60, a second cleaning unit 70 and a third cleaning unit 80. The first through third units 60, 70 and 80 may sequentially remove particles 11 (refer to FIG. 6) on the substrate W.

Figure 3:
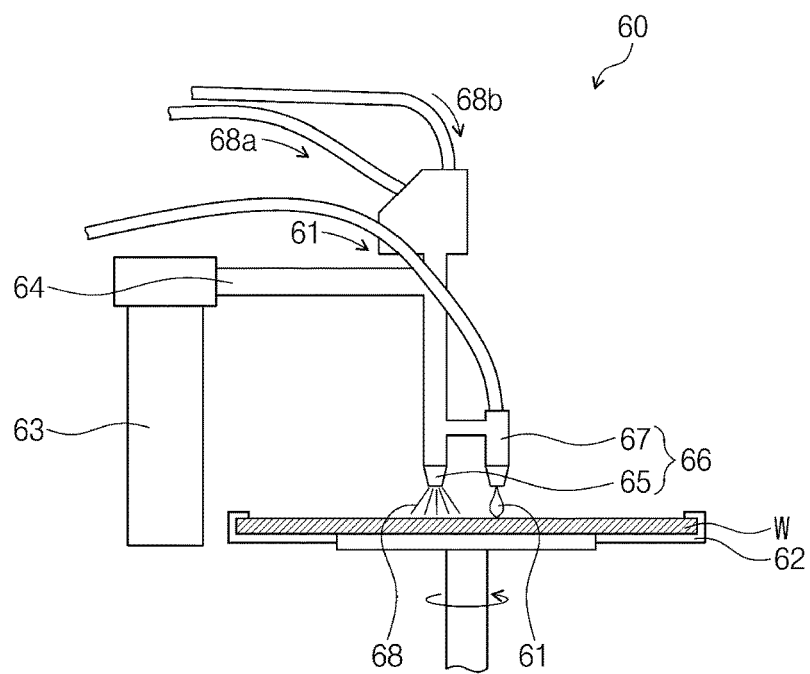
FIG. 3 is a diagram illustrating a first cleaning unit of FIG. 2 according to example embodiments.

FIG. 3 is a diagram illustrating the first cleaning unit 60 of FIG. 2 according to example embodiments.

Referring to FIG. 3, the first cleaning unit 60 may clean the substrate W with a first chemical liquid 61 and a first spray 68. As an example, the first cleaning unit 60 may include a first chuck 62, a first shaft 63, a first arm 64 and a first dual nozzle (or a first double nozzle) 66.

The first chuck 62 may clamp the substrate W. The first chuck 62 may be configured to rotate the substrate W. For example, the first chuck 62 may rotate the substrate W at a speed of about 60 rpm to about 1000 rpm.

The first chuck 62 may be disposed adjacent to the first shaft 63. The first arm 64 may be connected to the first shaft 63. The first shaft 63 may rotate the first arm 64 to move the first dual nozzle 66 from the center of the substrate W toward a periphery thereof. For example, the first dual nozzle 66 may move from about the center of the substrate W to the periphery of the substrate W while cleaning the substrate W. The first dual nozzle 66 may include two holes respectively configured to provide two different materials from each other.

The first arm 64 may connect the first dual nozzle 66 to the first shaft 63. The first arm 64 may move the first dual nozzle 66 above the substrate W by rotation of the first shaft 63.

The first dual nozzle 66 may supply the first chemical liquid 61 and the first spray 68 to the substrate W. As an example, the first dual nozzle 66 may include a first high-pressure nozzle 65 and a first low-pressure nozzle 67. For example, the first chemical liquid 61 may be supplied by one nozzle of the first dual nozzle 66, and the first spray 68 may be supplied by another nozzle of the first dual nozzle 66. For example, the first dual nozzle 66 may include two nozzles connected with each other.

The first high-pressure nozzle 65 may be connected to the first arm 64. The first high-pressure nozzle 65 may be a jet spray nozzle or a two-fluid nozzle. For example, the first high-pressure nozzle 65 may be connected to two different pipes, which supply two different fluids to the first high-pressure nozzle 65 respectively. The first high-pressure nozzle 65 may supply the first spray 68 to the substrate W. The first spray 68 may include a first liquid 68a and a first transport gas 68b. The first liquid 68a may include de-ionized water, carbonated water, or isopropyl alcohol (IPA). The transport gas 68b may form (or convert) the first liquid 68a into in the first spray 68. The first transport gas 68b may include, for example, nitrogen gas or an inert gas. The first transport gas 68b may be supplied at a flow rate of about 50-300 liters per minute (lpm). The first spray 68 and the first transport gas 68b may be supplied to the substrate W at a pressure of about 2 atm to about 10 atm. For example, the first liquid 68a and the first transport gas 68b may be supplied to the first high-pressure nozzle 65 at a pressure of about 2 atm to about 10 atm.

The first low-pressure nozzle 67 may be connected to the first high-pressure nozzle 65. For example, the low-pressure nozzle 67 may be spaced a distance of about 5 cm from the first high-pressure nozzle 65. In some example embodiments, the first low-pressure nozzle 67 may be connected to the first arm 64 and the first high-pressure nozzle 65 may be connected to the first low-pressure nozzle 67.

The first low-pressure nozzle 67 may supply the first chemical liquid 61 to the substrate W. A pressure of the first chemical liquid 61 may be lower than that of the first spray 68. The first chemical liquid 61 may have a flow rate of about 50-800 cubic centimeters per minute (cpm), and a pressure of about 1 atm or an atmospheric pressure. For example, the pressure of the first chemical liquid 61 in the first low-pressure nozzle 67 may be between 0.8-1.2 atm. The first chemical liquid 61 may include an acidic solution. For example, the first chemical liquid 61 may include hydrofluoric acid (HF). The hydrofluoric acid may have a weight percentage of 0.01 wt % to 2 wt % of the first chemical liquid 61 (e.g., it may include HF having a weight percentage of 0.01 wt % to 2 wt % with respect to the first chemical liquid 61). The first chemical liquid 61 may be dissolved in the first liquid 68a. For example, the first chemical liquid 61 may be combined with the first liquid 68a on the substrate W to form a mixed, dissolved solution including the first chemical liquid 61 dissolved into the first liquid 68a that forms the first spray 68. For example, the mixed solution where the first chemical liquid 61 is dissolved into the first liquid 68a that forms the first spray 68 may be a homogeneously mixed liquid.

Figure 4:
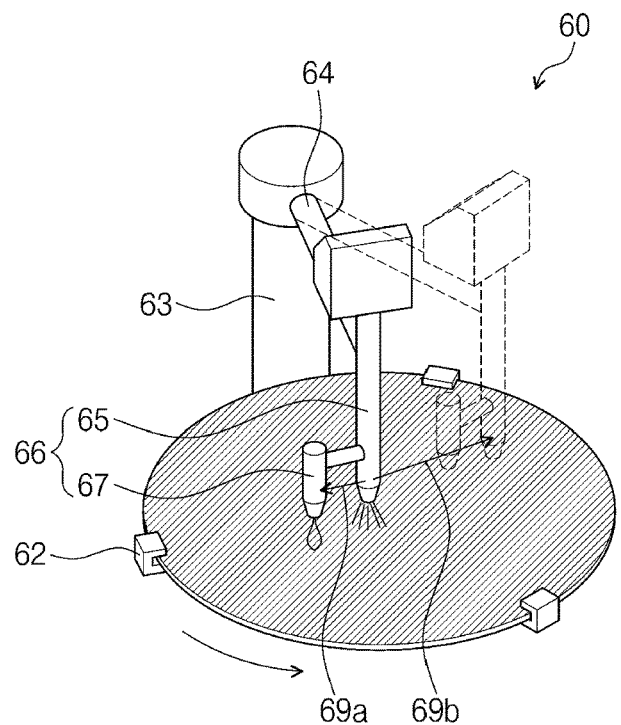
FIGS. 4 and 5 respectively are a perspective view and a plan view illustrating a movement direction of a first high-pressure nozzle and a first low-pressure nozzle of FIG. 3 according to example embodiments.
Figure 5:
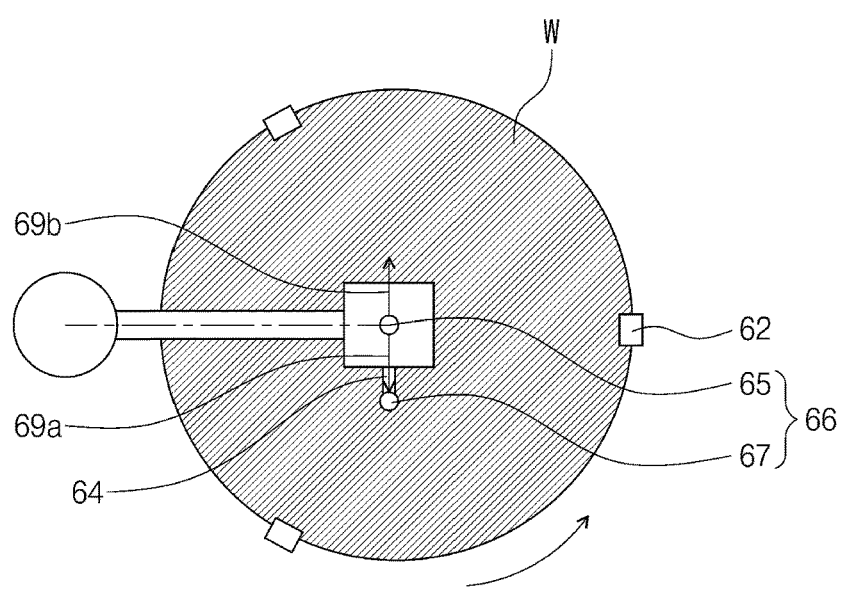

FIGS. 4 and 5 respectively are a perspective view and a plan view illustrating a movement direction of the first high-pressure nozzle 65 and a first low-pressure nozzle 67 of FIG. 3 according to example embodiments.

Referring to FIGS. 4 and 5, the first low-pressure nozzle 67 may be connected to the first high-pressure nozzle 65 and spaced apart from the first high-pressure nozzle 65 in a first direction 69a. The first low-pressure nozzle 67 and the first high-pressure nozzle 65 may be moved in a second direction 69b opposite to the first direction 69a by the first arm 64. In certain embodiments, the second direction 69b may not be directly opposite to the first direction 69a.

The first chemical liquid 61 and the first spray 68 may be supplied from the center of the substrate W toward the periphery thereof in the second direction 69b. For example, the first chemical liquid 61 and the first spray 68 may be provided from about the center of the substrate W to the periphery of the substrate W in the second direction 69b while cleaning the substrate W. The first chemical liquid 61 and the first spray 68 may be progressively scattered along the second direction 69b. The second direction 69b may be a direction in which the first spray 68 proceeds ahead of the first chemical liquid 61 while the first dual nozzle 66 moves in the second direction 69b. In some embodiments, the second direction 69b may be a circular movement direction because the first spray 68 rotates with respect to the first shaft 63. In other embodiments, the second direction may be a tangential direction of a tracking path of movement of the first dual nozzle 66.

Figure 6:
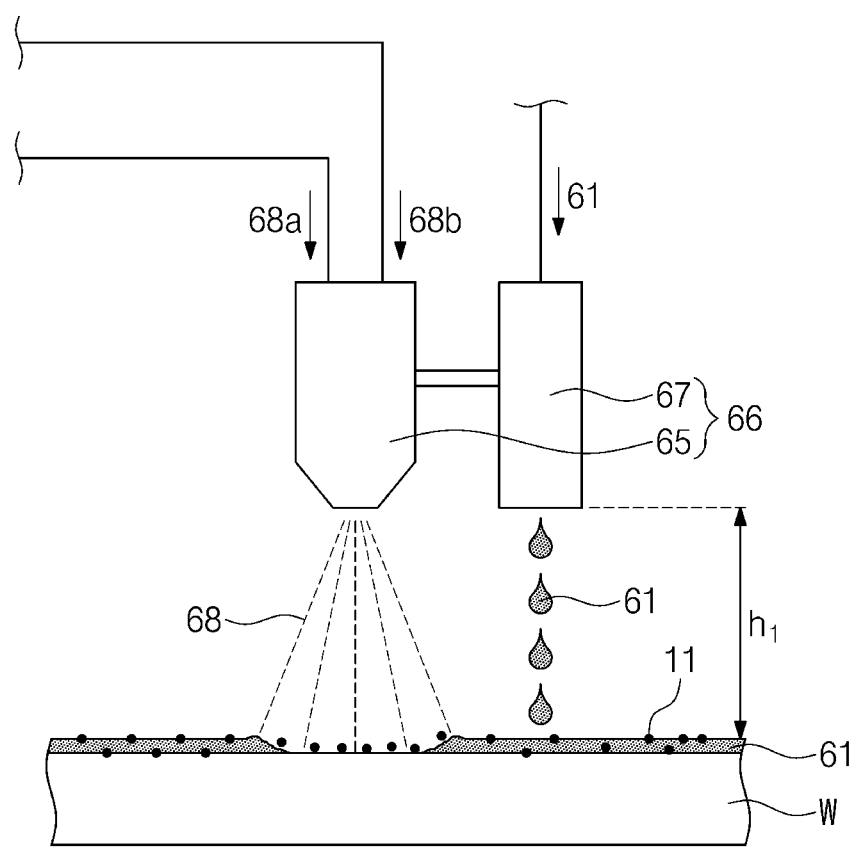
FIG. 6 is a diagram illustrating a first high-pressure nozzle and a first low-pressure nozzle of FIG. 3 according to example embodiments.

FIG. 6 is a diagram illustrating the first high-pressure nozzle 65 and the first low-pressure nozzle 67 of FIG. 3 according to example embodiments.

Referring to FIG. 6, the first high-pressure nozzle 65 and the first low-pressure nozzle 67 may be disposed to be vertically spaced by a first height h1 from a top surface of the substrate W. For example, the first height h1 may be about 5 cm. For example, the first height h1 may be 3-7 cm. The first low-pressure nozzle 67 may be positioned higher than the first high-pressure nozzle 65, e.g., by less than 100 mm.

The first spray 68 may separate some of particles 11 from the substrate W at a high pressure. In some embodiments, the first spray 68 may wet a portion of a top surface of the substrate W. The first chemical liquid 61 may be dissolved by the first spray 68. For example, the first chemical liquid 61 may be combined with the first liquid 68a on the substrate W to form a mixed, dissolved solution including the first chemical liquid 61 dissolved into the first liquid 68a that forms the first spray 68. For example, the mixed solution where the first chemical liquid 61 is dissolved into the first liquid 68a that forms the first spray 68 may be a homogeneously mixed liquid. The first spray 68 may apply a physical force to the first chemical liquid 61 to increase a cleaning power together with the first chemical liquid 61.

The first chemical liquid 61 may be dropped on the substrate W. The first low-pressure nozzle 67 may be a droplet nozzle. In some embodiments, the first chemical liquid 61 may drop on the substrate W by gravity without substantial pressure from the first low-pressure nozzle 67. The first chemical liquid 61 may detach some of the particles 11 from a top surface of an upper portion of the substrate W, for example, by etching the top surface thereof. For example, the upper portion of the substrate W may be formed of a silicon oxide layer. The particles 11 may be generated in the polishing apparatus 30 when chemically mechanically polishing the substrate W. The particles 11 include abrasive particles, silicon oxide particles or metal particles. The first chemical liquid 61 and some of the detached particles 11 may be removed from the substrate W by rotation of the first chuck 62 of FIG. 3. For example, the particles 11 and the first chemical liquid 61 may be removed by a centrifugal force produced by the rotation of the first chuck 62.

Figure 7:
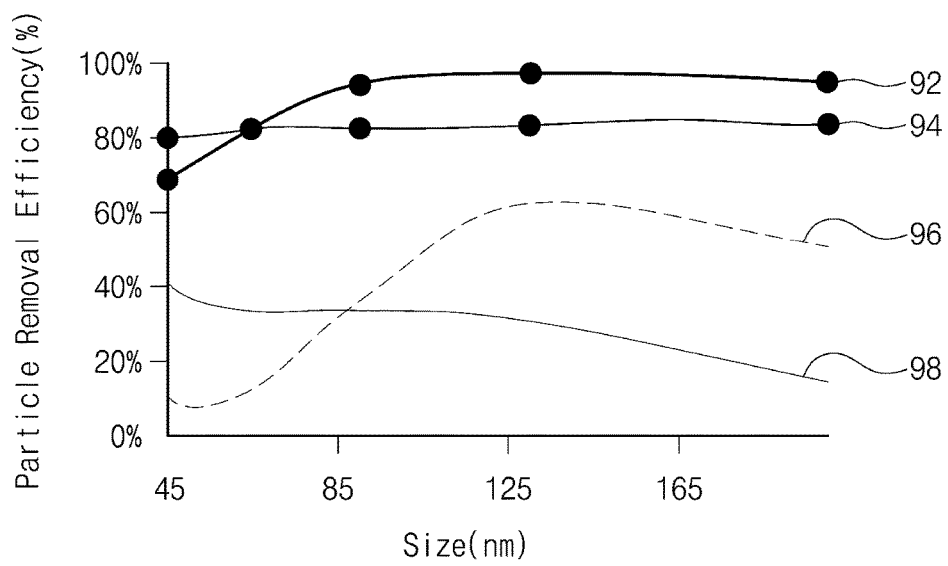
FIG. 7 is a graph illustrating a particle removal efficiency of a first chemical liquid and a first spray depending on sizes of particles shown in FIG. 6 according to example embodiments.

FIG. 7 is a graph illustrating a particle removal efficiency of the first chemical liquid 61 and the first spray 68 depending on sizes of particles 11 shown in FIG. 6 according to example embodiments.

Referring to FIG. 7, data 92 shows a particle removal efficiency of the first spray 68 and the first chemical liquid 61 when the first dual nozzle 66 moves in the second direction 69b. Data 94 shows a particle removal efficiency of the first spray 68 and the first chemical liquid 61 when the first dual nozzle 66 moves in the first direction 69a. Data 96 shows a particle removal efficiency of the first spray 68 without providing the first chemical liquid 61. Data 98 shows a particle removal efficiency of the first chemical liquid 61 without providing the first spray 68. When the first spray 68 moves ahead of the first chemical liquid 61 in the second direction 69b, the particle removal efficiency may be greatest. Accordingly, a cleaning efficiency of the particles 11 may be improved when a process is performed as described in relation to data 92 in FIG. 7.

For example, the particle removal efficiency 92 of the first spray 68 and the first chemical liquid 61 when the nozzle 66 moves in the second direction 69b is up to about 92%. The particle removal efficiency 92 increases from about 70% to about 92% when the size of the particles 11 increases from about 45 nm to about 100 nm in diameter or length. The particle removal efficiency 92 is constant at about 92% with respect to the size of the particles 11 ranging from about 100 nm to about 200 nm in diameter or length. A size of a particle 11 may be measured with its diameter when the particle 11 has a circular shape or a ball shape. A size of a particle 11 maybe measured with its length when the particle 11 has a non-circular or non-ball shape. Most of the particles 11 may be removed. Therefore, the first spray 68 and the first chemical liquid 61 remove the particles 11. For example, the first spray 68 and the first chemical liquid 61 may mainly remove metal particles. For example, the first spray 68 and the first chemical liquid 61 may mainly remove large sized metal particles.

The particle removal efficiency 94 of the first spray 68 and the first chemical liquid 61 when the nozzle 66 moves in the first direction 69a is up to about 85%. The particle removal efficiency 94 is constant at about 85% with respect to particles 11 having sizes of about 45 nm to about 200 nm in diameter or length. The first direction 69a is a direction in which the first chemical liquid 61 proceeds ahead of the first spray 68 while the first dual nozzle 66 moves in the first direction 69b. Although not shown, when the first chemical liquid 61 is supplied to the substrate W ahead of the first spray 68, the first chemical liquid 61 may be splattered on the substrate W by the first spray 68. Therefore, cleaning efficiency of the particles 11 may get low. In some examples, when the first spray 68 reaches the periphery (or an edge) of the substrate W, the first chemical liquid 61 may drip outside the substrate W. Thus, the first chemical liquid 61 may be wasted.

The particle removal efficiency 96 of the first spray 68 without providing the first chemical liquid 61 is up to about 64%. The first spray 68 may remove the particles 11 more effectively than the first chemical liquid 61. The particle removal efficiency 96 of the first spray 68 gradually increases from about 20% to about 64% when the size of the particles 11 increases from about 50 nm to about 125 nm in diameter or length. The particle removal efficiency 96 of the first spray 68 decreases from about 60% to about 50% when the size of the particles 11 increases from about 125 nm to about 200 nm in diameter or length.

The particle removal efficiency 98 of the first chemical liquid 61 without providing the first spray 68 is up to about 44%. When the size of the particles 11 increases from about 45 nm to about 200 nm in diameter or length, the particle removal efficiency 98 of the first chemical liquid 61 decreases from about 44% to about 20%.

Although not shown, when the first high-pressure nozzle 65 moves in the first direction 69a, the first low-pressure nozzle 67 may proceed ahead of the first high-pressure nozzle 65. For example, the first low-pressure nozzle 67 may move ahead of a movement area of the first high-pressure nozzle 65. In some embodiments, after the first chemical liquid 61 is supplied to a bowl (not shown) outside the substrate W, the first chemical liquid 61 may be supplied to the substrate W. However, in such a case, cleaning failure of the substrate W may occur due to the first chemical liquid 61. For example, the first chemical liquid 61 may be supplied to the substrate W with supplying the first spray 68 to the substrate W because of an interval between the first high-pressure and low-pressure nozzles 65 and 67 when nozzle 66 moves to the first direction 69a. Furthermore, when the first spray 68 is not supplied to the periphery of the substrate W, a cleaning power at the periphery of the substrate W may be reduced such that the cleaning failure may be generated.

For example, when a cleaning process starts, the first low-pressure nozzle 67 may be located closer to the center of the substrate W compared to the first high-pressure nozzle 65. However, when the first low-pressure nozzle 67 is located on the periphery of the substrate W, the first high-pressure nozzle 65 may be located closer to the center of the substrate W compared to the first low-pressure nozzle 67, and the first chemical liquid 61 may drop from the first low-pressure nozzle 67 to outside of the substrate W. The dropped first chemical liquid 61 may be gathered in a bowl. The first chemical liquid 61 spattering from and/or gathered in the bowl may be re-supplied to the substrate W. Because reverse contamination may be generated by the re-supplied first chemical liquid 61, a supply of the first spray 68 from the first high-pressure nozzle 65 may stop before the first spray 68 reaches to an edge of the substrate W (e.g., in a middle of the substrate) to prevent such reverse contamination, and thus the cleaning power on the periphery of the substrate W may be reduced. Accordingly, a cleaning failure may occur.

Figure 8:
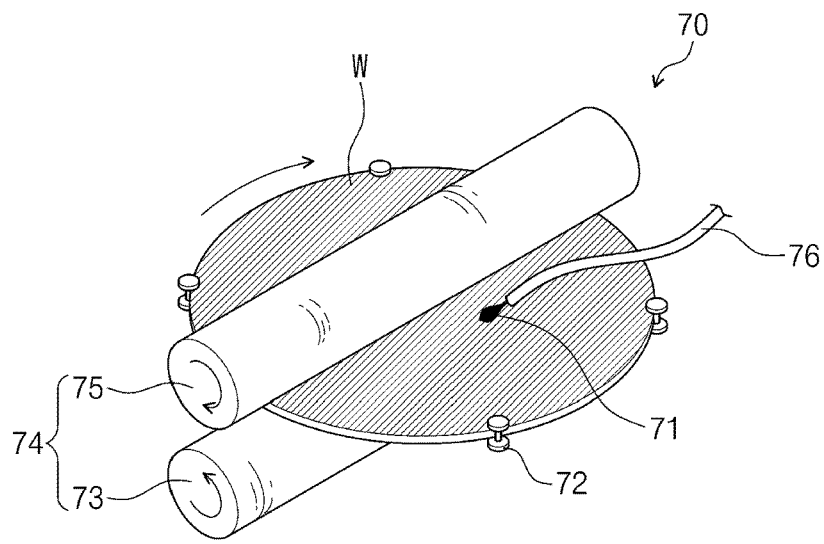
FIG. 8 is a perspective view illustrating a second cleaning unit of FIG. 2 according to example embodiments.

FIG. 8 is a perspective view illustrating the second cleaning unit 70 of FIG. 2 according to example embodiments.

Referring to FIGS. 2 and 8, the second cleaning unit 70 may include a plurality of rollers 72, a plurality of brushes 74 and a single nozzle 76. For example, the single nozzle 76 may not be connected to any other nozzle near the single nozzle (e.g., in a nozzle shaft or in a nozzle arm.)

The plurality of rollers 72 may be disposed and configured to hold or support the periphery (or the edge) of the substrate W. For example, four rollers 72 may be arranged at regular intervals at the periphery of the substrate W. The rollers 72 may be configured to rotate the substrate W.

The plurality of brushes 74 may separate the particles 11 from the substrate W. For example, the brushes 74 may include a lower brush 73 and an upper brush 75. The substrate W may be disposed between the lower brush 73 and the upper brush 75. The lower brush 73 may be disposed under the substrate W. The upper brush 75 may be disposed above the substrate W. The lower brush 73 and the upper brush 75 may respectively rotate in a direction opposite to each other. The upper brush 75 may remove some of the particles 11 on the substrate W. Therefore, the upper brush 75 removes the particles 11. For example, the upper brush 75 may mainly remove the abrasive particles.

The single nozzle 76 may supply a second chemical liquid 71 to the substrate W. For example, the second chemical liquid 71 may include an alkaline solution such as an ammonia water. The ammonia water may have a weight percentage of 0.01 wt % to 4 wt % with respect to the second chemical liquid 71 (e.g., the ammonia water may have ammonia (NI-140H) in the ammonia water with a weight percentage of 0.01 wt % to 4 wt % of the ammonia water). The second chemical liquid 71 may prevent the particles 11 from adhering to the substrate W. For example, the second chemical liquid 71 may be helpful keeping particles 11 detached from the substrate W from being reattached to the substrate W. The single nozzle 76 may be disposed to precede the brushes 74, e.g., with respect to the substrate W.

Referring again to FIGS. 6 and 8, the particles 11 that are not removed by the first cleaning unit 60 may contaminate the brushes 74. The first spray 68 and the first chemical liquid 61 supplied from the first dual nozzle 66 of the first cleaning unit 60 may reduce contamination of the brushes 74. For example, as the size of the particles 11 that are not removed by the first cleaning unit 60, may increase the contamination of the brushes 74. In a following cleaning process of the second cleaning unit 70, the contaminated brushes 74 may contaminate another substrate W. The contamination of the substrate W by the contaminated brushes 74 may be called reverse contamination of the substrate W. According to example embodiments, the first spray 68 and the first chemical liquid 61 supplied from the first dual nozzle 66 of the first cleaning unit 60 may remove most of the particles 11 on the substrate W such that the contamination of the brushes 74 and the reverse contamination of the substrate W may be reduced.

Figure 9:
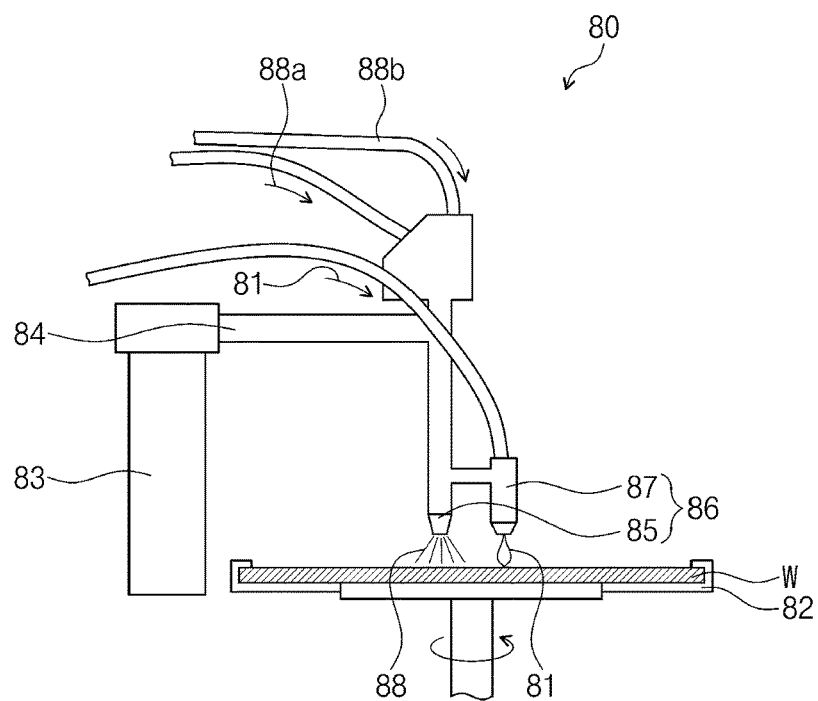
FIG. 9 is a perspective view illustrating a third cleaning unit of FIG. 2 according to example embodiments.

FIG. 9 is a perspective view illustrating the third cleaning unit 80 of FIG. 2 according to example embodiments.

Referring to FIG. 9, the third cleaning unit 80 may clean the substrate W using a third chemical liquid 81 and a second spray 88. As an example, the third cleaning unit 80 may include a second chuck 82, a second shaft 83, a second arm 84 and a second dual nozzle 86.

The second chuck 82 may clamp the substrate W. The second chuck 82 may be configured to rotate the substrate W. For example, the second chuck 82 may rotate the substrate W at about 60 rpm to about 1000 rpm.

The second shaft 83 may be disposed adjacent to the second chuck 82. The second arm 84 may be connected to the second shaft 83. The second shaft 83 may rotate the second arm 84 to move the second dual nozzle 86 from the center of the substrate W toward the periphery thereof. For example, the second dual nozzle 86 may move from about the center of the substrate W to the periphery of the substrate W while cleaning the substrate W.

The second arm 84 may connect the second shaft 83 to the second dual nozzle 86. For example, one end of the second arm 84 may be connected to the second shaft 83 and the other end of the second arm 84 may be connected to the second dual nozzle 86. The second arm 84 may move the second dual nozzle 86 above the substrate W by a rotation of the second shaft 83.

The second dual nozzle 86 may supply the third chemical liquid 81 and the second spray 88 to the substrate W. For example, the second dual nozzle 86 may be vertically spaced apart from a top surface of the substrate W by a height of about 5 cm, e.g., 3-7 cm. For example, the second dual nozzle 86 may include two different nozzles configured to supply two different materials respectively. For example, the third chemical liquid 81 may be supplied by one nozzle of the second dual nozzle 86, and the second spray 88 may be supplied by another nozzle of the second dual nozzle 86. For example, the second dual nozzle 86 may include two nozzles connected to each other.

In some embodiments, the second dual nozzle 86 may include a second high-pressure nozzle 85 and a second low-pressure nozzle 87.

The second high-pressure nozzle 85 may be connected to the second arm 84. The second high-pressure nozzle 85 may be a jet spray nozzle or a two-fluid nozzle. For example, the second high-pressure nozzle 85 may be connected to two different pipes which respectively supply two different fluids to the nozzle 85. The second high-pressure nozzle 85 may supply the second spray 88 to the substrate W. The second spray 88 may have the same pressure as the first spray 68. For example, the second spray 88 may have a pressure of about 2 atm to about 10 atm. The second spray 88 may include a second liquid 88a and a second transport gas 88b. The second liquid 88a may be the same as the first liquid 68a. The second liquid 88a may include, for example, a deionized water, a carbonated water or isopropyl alcohol. The second transport gas 88b may be the same as the first transport gas 68b. The second transport gas 88b may include nitrogen gas or an inert gas. The second transport gas 88b may be supplied at a flow rate of about 50-300 liters per minute (lpm). The second spray 88 and the second transport gas 88b may be supplied to the substrate W at a pressure of about 2 atm to about 10 atm. For example, the second liquid 88a and the second transport gas 88b may be supplied to the second high-pressure nozzle 85 at a pressure of about 2 atm to about 10 atm.

The second low-pressure nozzle 87 may be connected to the second high-pressure nozzle 85. For example, the second low-pressure nozzle 87 may be spaced a distance of about 5 cm (e.g., 3-7 cm) from the second high-pressure nozzle 85. The second low-pressure nozzle 87 may supply the third chemical liquid 81 to the substrate W. A pressure of the third chemical liquid 81 may be lower than that of the second spray 88. The third chemical liquid 81 may include alkaline solution. The third chemical liquid 81 may include an ammonia water. A flow rate and the pressure of the third chemical liquid 81 may be the same as the flow rate and the pressure of the first chemical liquid 61. For example, the third chemical liquid 81 may have a flow rate of about 50-800 cubic centimeters per minute (cpm) and about an atmospheric pressure (e.g., 0.8-1.2 atm). For example, the pressure of the third chemical liquid 81 in the second low-pressure nozzle 87 may be between 0.8 atm and 1.2 atm. The third chemical liquid 81 may be dissolved in the second liquid 88a. For example, the third chemical liquid 81 may be combined with the second liquid 88a on the substrate W to form a mixed, dissolved solution including the third chemical liquid 81 dissolved into the second liquid 88a that forms the second spray 88. For example, the mixed solution where the third chemical liquid 81 is dissolved into the second liquid 88a that forms the second spray 88 may be a homogeneously mixed liquid. In some embodiments, the second low-pressure nozzle 87 may be connected to the second arm 84, and the second high-pressure nozzle 85 may be connected to the second low-pressure nozzle 87.

Figure 10:
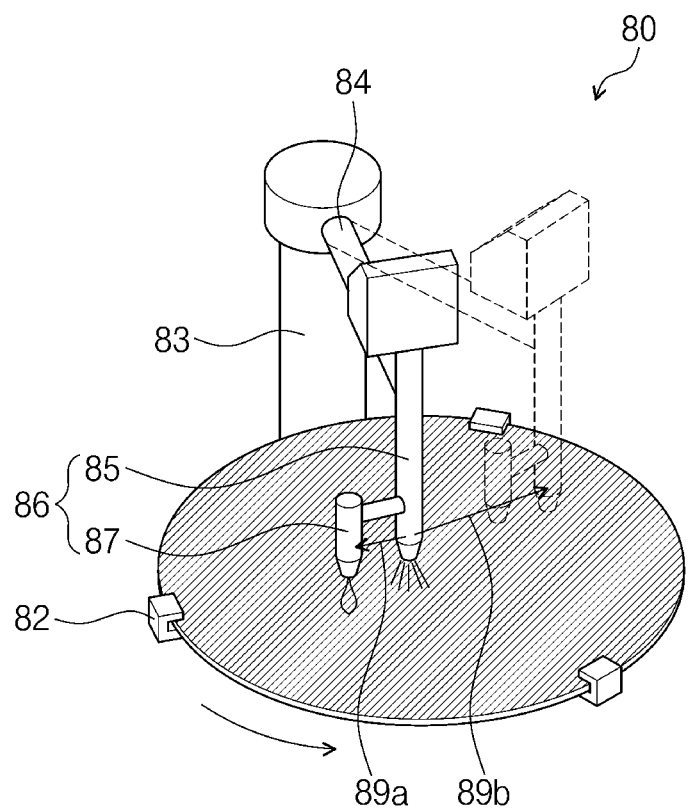
FIG. 10 is a perspective view illustrating a movement direction of a second high-pressure nozzle and a second low-pressure nozzle of FIG. 9 according to example embodiments.

FIG. 10 is a perspective view illustrating a movement direction of the second high-pressure nozzle 85 and the second low-pressure nozzle 87 of FIG. 9 according to example embodiments.

Referring to FIGS. 4 and 10, the second low-pressure nozzle 87 may be connected to the second high-pressure nozzle 85, and spaced apart from the second high-pressure nozzle 85 in a third direction 89a. The third direction 89a may be equal to the first direction 69a. The second low-pressure nozzle 87 and the second high-pressure nozzle 85 may move in a fourth direction 89b by the second arm 84. The fourth direction 89b may be equal to the second direction 69b and may be opposite to the third direction 89a. In certain embodiments, the fourth direction 89b may not be directly opposite to the third direction 89a.

The third chemical liquid 81 and the second spray 88 may be supplied along the fourth direction 89b from the center of the substrate W toward the periphery thereof. For example, the third chemical liquid 81 and the second spray 88 may be provided from about the center of the substrate W to the periphery of the substrate W in the fourth direction 89b while cleaning the substrate W. The third chemical liquid 81 and the second spray 88 may be progressively scattered (or sprayed) along the fourth direction 89b. The fourth direction 89b may be a direction in which the second spray 88 proceeds ahead of the third chemical liquid 81 while the second dual nozzle 86 moves in the fourth direction 89b. In some embodiments, the fourth direction 89b may be a circular movement direction because the second spray 88 rotates with respect to the second shaft 83. In other embodiments, the fourth direction 89b may be a tangential direction of a tracking path of movement of the second dual nozzle 86.

Figure 11:
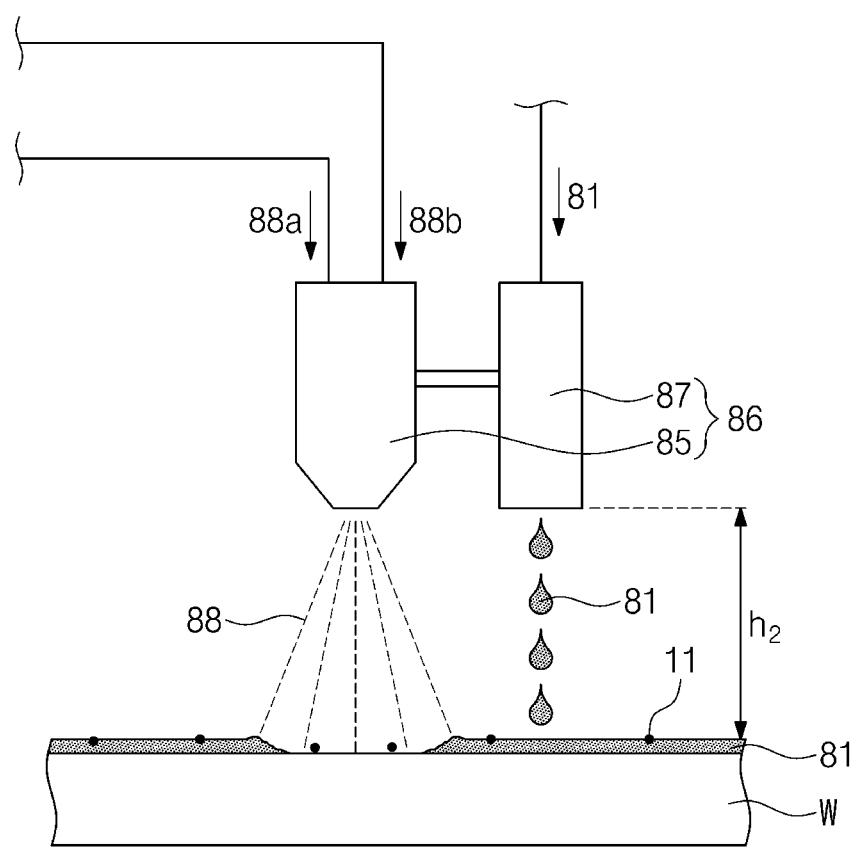
FIG. 11 is a diagram illustrating a second high-pressure nozzle and a second low-pressure nozzle of FIG. 9 according to example embodiments.

FIG. 11 is a diagram illustrating the second high-pressure nozzle 85 and the second low-pressure nozzle 87 of FIG. 9 according to example embodiments.

Referring to FIG. 11, the second high-pressure nozzle 85 and the second low-pressure nozzle 87 may be disposed to be vertically spaced apart from a top surface of the substrate W by a second height h2. The second height h2 may be about 5 cm, e.g., 3-7 cm. The second low-pressure nozzle 87 may be positioned higher than the second high-pressure nozzle 85 by less than 100 mm.

The second spray 88 may separate some of the particles 11 from the substrate W at a high pressure. The third chemical liquid 81 may be dissolved by the second spray 88. For example, the third chemical liquid 81 may be combined with the second liquid 88a on the substrate W to form a mixed, dissolved solution including the third chemical liquid 81 dissolved into the second liquid 88a that forms the second spray 88. For example, the mixed solution where the third chemical liquid 81 is dissolved into the second liquid 88a that forms the second spray 88 may be a homogeneously mixed liquid.

The third chemical liquid 81 may be dropped on the substrate W. The second low-pressure nozzle 87 may be a droplet nozzle. In some embodiments, the third chemical liquid 81 may drop on the substrate W by gravity without substantial pressure from the first low-pressure nozzle 67. The third chemical liquid 81 may prevent the particles 11 from adhering to the substrate W, for example, using an electrostatic repulsive force. Therefore, the second spray 88 removes the particles 11. For example, the second spray 88 may mainly remove silicon oxide particles.

Referring again to FIG. 10, the particles 11 may be removed from the substrate W by a chemical cleaning force of the third chemical liquid 81, a physical force of the second spray 88 and a centrifugal force produced by rotation of the substrate W. The third chemical liquid 81 and some of the particles 11 may be removed from the substrate W by the centrifugal force.

Figure 12:
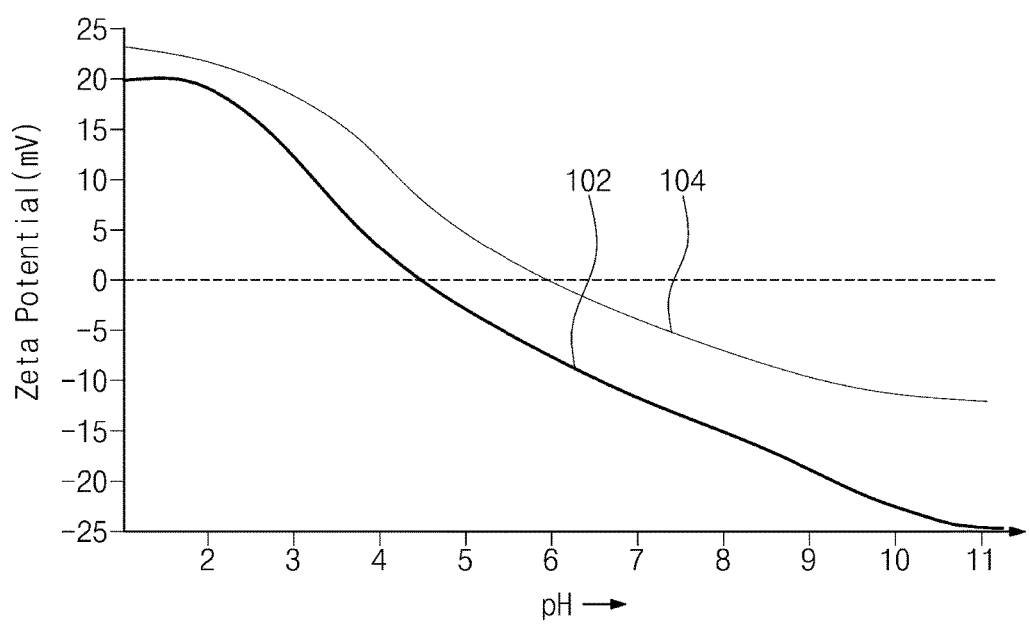
FIG. 12 is a graph illustrating zeta potentials of a substrate and particles depending on a pH value of a third chemical liquid according to example embodiments.

FIG. 12 is a graph illustrating zeta potentials of a substrate and particles depending on a pH value of the third chemical liquid 81 of FIG. 11 according to example embodiments.

Referring to FIG. 12, electrostatic repulsive forces of the substrate W and the particles 11 respectively increase when a magnitude of absolute values of zeta potentials of the substrate W and the particles 11 increases. For example, when a pH value of third chemical liquid 81 increases, a zeta potential 102 of the substrate W and a zeta potential 104 of the particles 11 may have the same electric polarity, and an absolute value of zeta potential increases. When the zeta potential of the same electric polarity increases, the electrical repulsive force may increase. An increasing difference between the zeta potential 102 of the substrate W and the zeta potential 104 of the particles 11 is not big, and may be ignored. The particles 11 may be separated from the substrate W to drift in the third chemical liquid 81. A buoyancy of the particles 11 in the third chemical liquid 81 may be proportional to the electrostatic repulsive forces between the substrate W and the particles 11. Since the third chemical liquid 81 includes a strong alkaline solution such as an ammonia water, the particles 11 may be prevented from adhering to the substrate W. Therefore, the contamination caused by the particles 11 may be prevented or reduced.

A method of manufacturing a semiconductor device using the chemical mechanical polishing system 100 according to example embodiments as described above will be described below.

Figure 13:
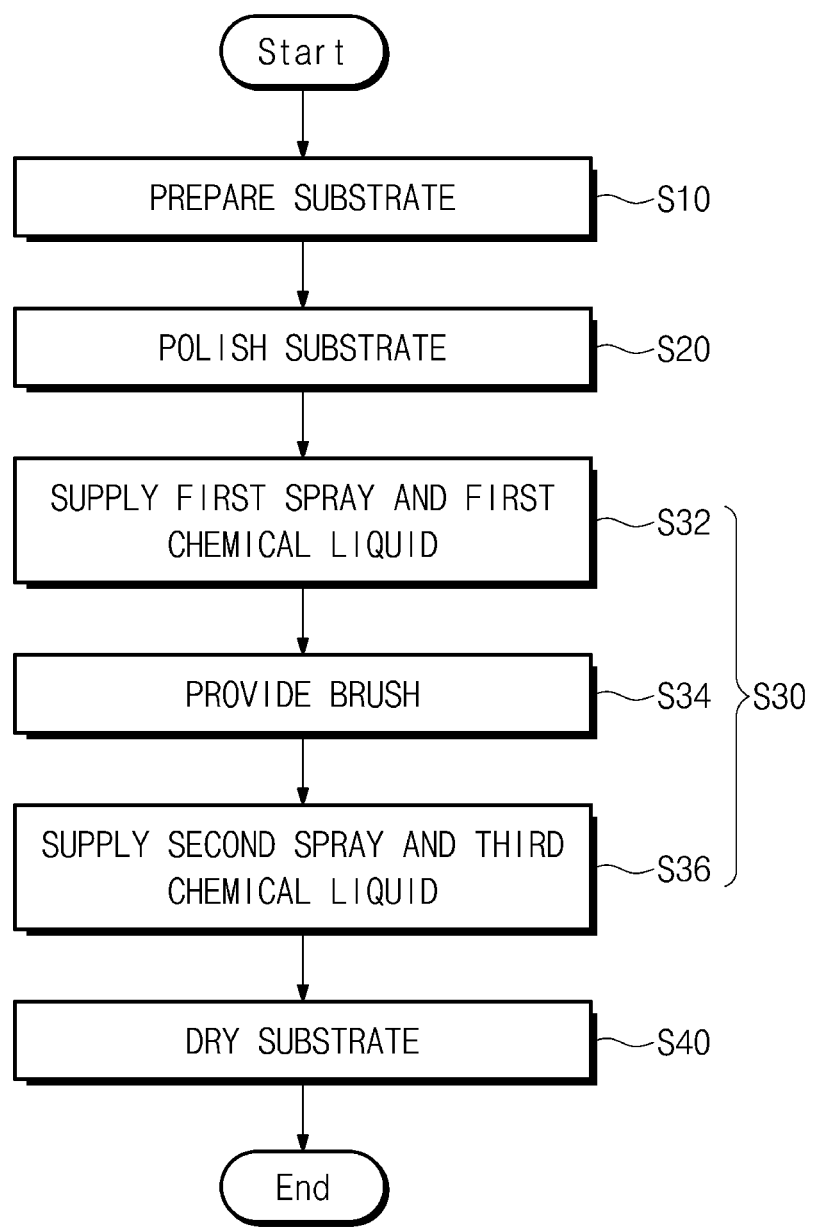
FIG. 13 is a flow chart illustrating a method of manufacturing a semiconductor device using a chemical mechanical polishing system according to example embodiments.

FIG. 13 is a flow chart illustrating a method of manufacturing a semiconductor device using the chemical mechanical polishing system 100 according to example embodiments.

Referring FIG. 13, a method of manufacturing a semiconductor device according to example embodiments may include preparing a substrate W (S10), polishing the substrate W (S20), cleaning the substrate W (S30) and drying the substrate W (S40).

In operation S10, the substrate W may be prepared to have a plurality of layers for forming a semiconductor device through a plurality of unit processes. The semiconductor device may include a memory device, a solid state driver, or a logic application processor. The semiconductor device may include an active element such as a transistor or a diode, or a passive element such as a capacitor or a resistor. The plurality of layers may include an insulating layer or a conductive layer.

Referring to FIGS. 1 and 13, in operation S20, the substrate W may be chemically mechanically polished in the polishing apparatus 30. The substrate W may be polished to be planar by the polishing apparatus 30. Although not shown, a polishing target layer of the substrate W may include an interlayer insulating layer such as a silicon oxide layer. In some embodiments, a polishing target layer of the substrate W may include a metal layer such as a copper layer.

Referring to FIGS. 2, 3 and 13, in operation S30, the substrate W may be cleaned by a wet cleaning in the cleaning apparatus 40 after chemical mechanical polishing is performed. In some embodiments, the cleaning of the substrate W in operation S30 may include supplying the first spray 68 and the first chemical liquid 61 to the substrate W (S32), supplying the second chemical liquid 71 to the substrate W and brushing the substrate W (S34), and supplying the second spray 88 and the third chemical liquid 81 to the substrate W (S36).

Referring to FIGS. 3 through 6 and 13, in operation S32, the first spray 68 and the first chemical liquid 61 may be supplied to the substrate W from the first dual nozzle 66 of the first cleaning unit 60. The first chemical liquid 61 may be supplied at a lower pressure than the pressure of the first spray 68. The first spray 68 may be supplied at a pressure of 2 atm to 10 atm. The first spray 68 may be supplied to the substrate W ahead of the first chemical liquid 61. The first chemical liquid 61 may be supplied at about 1 atmosphere (e.g., 0.8-1.2 atm). The first spray 68 may be supplied ahead of the first chemical liquid 61 in the second direction 69b from the center of the substrate W toward the periphery of the substrate W. For example, the first chemical liquid 61 and the first spray 68 may be provided from about the center of the substrate W to the periphery of the substrate W in the second direction 69b while cleaning the substrate W. The first spray 68 and the first chemical liquid 61 may separate some of the particles 11 from the substrate W. The first chemical liquid 61 and at least some of the separated particles 11 may be removed by a centrifugal force produced by a rotation of the substrate W.

Referring to FIGS. 8 and 13, in operation 34, the substrate W may be provided between the brushes 74 of the second cleaning unit 70, and the third chemical liquid 71 may be supplied to the substrate W from the single nozzle 76 of the second cleaning unit 80. The brushes 74 may separate some of the particles 11 from the substrate W, and the second chemical liquid 71 may prevent at least some of the separated particles 11 from re-adhering to the substrate W.

Referring to FIGS. 9 through 11 and 13, in operation S36, the second spray 88 and the third chemical liquid 81 may be supplied from the second dual nozzle 86 of the third cleaning unit 80. The second spray 88 may be supplied ahead of the third chemical liquid 81 in the fourth direction 89b from the center of the substrate W toward the periphery of the substrate W. For example, the third chemical liquid 81 and the second spray 88 may be provided from about the center of the substrate W to the periphery of the substrate W in the fourth direction 89b while cleaning the substrate W. The second spray 88 may remove some of the particles 11 from the substrate W, and the third chemical liquid 81 may prevent at least some of the separated particles 11 from re-adhering to the substrate W by an electrostatic repulsive force. The third chemical liquid 81 and at least some of the separated particles 11 may be removed by a centrifugal force produced by a rotation of the substrate W.

Referring again to FIGS. 1 and 13, in operation S40, the substrate W may be dried by removing moisture from the substrate W in the drying apparatus 50.

Figure 14:
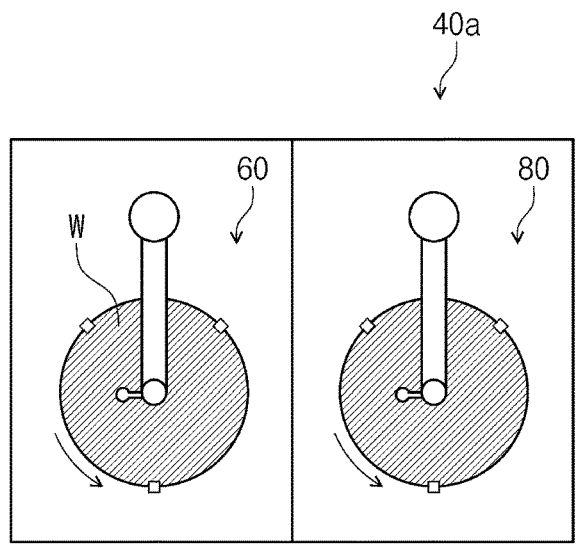
FIG. 14 is a plan view illustrating a cleaning apparatus of FIG. 1 according to example embodiments.

FIG. 14 is a plan view illustrating a cleaning apparatus of FIG. 1 according to example embodiments.

Referring to FIGS. 6, 11 and 14, a cleaning apparatus 40a may include the first cleaning unit 60 and the third cleaning unit 80. In the case where a pressure of the first spray 68 of the first cleaning unit 60 and a pressure of the second spray 88 of the third cleaning unit further increase, the second cleaning unit 70 of FIG. 2 may be omitted. The pressures of the first and second sprays 68 and 88 may be proportional to an impact force of the first and second sprays 68 and 88 on the substrate W. Although the impact force increases, patterns of the substrate W may not collapse and/or be damaged since the substrate W is planarized by the chemical mechanical polishing process.

Figure 15:
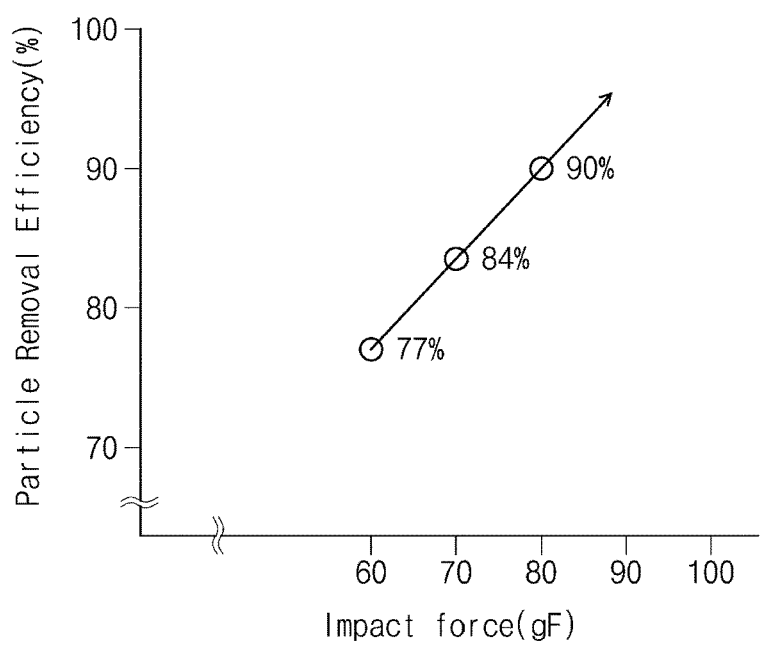
FIG. 15 is a graph illustrating a particle removal efficiency depending on an impact force of a first spray and a second spray of FIGS. 6 and 11 according to example embodiments.

FIG. 15 is a graph illustrating a dependency of a particle removal efficiency on the impact force of the first spray 68 and the second spray 88 of FIGS. 6 and 11 according to example embodiments.

Referring to FIG. 15, when the impact force of the first spray 68 and the second spray 88 increases, a particle removal efficiency increases. For example, when the impact force of the first and second sprays 68 and 88 increases from 60 gF to 80 gF, the particle removal efficiency increases from 77% to 90%.

Therefore, in the case where the impact force of the first and second sprays 68 and 88 increases to more than 80 gF, the cleaning apparatus 40a may have a particle removal efficiency of 100% without the second cleaning unit 70 of FIG. 2. Further, the cleaning apparatus 40a may prevent reverse contamination of the substrate W caused by contamination of the brushes 74.

The above disclosure should be considered illustrative, and not restrictive, and the appended claims are intended to cover modifications, enhancements, and other embodiments, which fall within the scope of the inventive concepts. Thus, the scope is to be determined by the broadest permissible interpretation of the following claims and their equivalents, and shall not be restricted or limited by the foregoing detailed description.

What is claimed is:

1. A cleaning method, comprising:
   supplying, to a substrate by a dual nozzle, a first chemical liquid and a first spray, the first spray including a first liquid dissolving the first chemical liquid; and
   moving the dual nozzle in a first direction,
   wherein the dual nozzle comprises a first nozzle and a second nozzle,
   wherein the first nozzle supplies the first spray to the substrate and the second nozzle supplies the first chemical liquid to the substrate while the dual nozzle moves in the first direction, and
   wherein the first nozzle proceeds ahead of the second nozzle in the first direction while the dual nozzle moves in the first direction.

2. The cleaning method of claim 1, wherein the first chemical liquid includes an acidic solution.

3. The cleaning method of claim 1, wherein the first chemical liquid includes hydrofluoric acid.

4. The cleaning method of claim 1, wherein the first direction is a circular movement direction.

5. The cleaning method of claim 1, wherein the first direction is a tangential direction of movement of the dual nozzle.

6. The cleaning method of claim 1, further comprising brushing a surface of the substrate and supplying a second chemical liquid onto the substrate while the brushing of the surface of the substrate is performed.

7. The cleaning method of claim 1,
   wherein inside pressure of the second nozzle is between 0.8 atm and 1.2 atm.

8. The cleaning method of claim 1,
   wherein inside pressure of the first nozzle is between 2 atm and 10 atm.

9. The cleaning method of claim 1, wherein the first chemical liquid includes ammonia water,
   wherein the ammonia water has ammonia ($NH_4OH$) in the ammonia water with a weight percentage of 0.01 wt % to 4 wt % of the ammonia water.

10. The cleaning method of claim 3, wherein the hydrofluoric acid has a weight percentage of 0.01 wt % to 2 wt % in relation to the first chemical liquid.

11. The method of claim 1, wherein the second nozzle traces the first nozzle while the dual nozzle moves in the first direction.

12. The method of claim 1, wherein both of the first nozzle and the second nozzle are elongated, and the elongated directions of both of the first and second nozzles are perpendicular to the substrate.

13. The method of claim 1, wherein the first spray proceeds ahead of the first chemical liquid in the first direction to remove a first particle on the substrate, and the first chemical liquid follows behind the first spray to remove a second particle smaller than the first particle on the substrate.

14. A cleaning method, comprising:
    supplying, to a substrate by a dual nozzle, a first chemical liquid and a first spray, the first spray including a first liquid dissolving the first chemical liquid; and
    moving the dual nozzle in a first direction,
    wherein the first spray proceeds ahead of the first chemical liquid while the first spray and the first chemical liquid are supplied to the substrate, and
    wherein the first spray is supplied at a higher pressure than the first chemical liquid and the first direction is a direction from a center of the substrate toward a periphery of the substrate.

15. A method of manufacturing a semiconductor device, the method comprising:
    preparing a substrate;
    polishing the substrate; and
    cleaning the substrate to remove particles on the substrate after polishing the substrate,
    wherein the cleaning of the substrate comprises:
    providing, to the substrate by a dual nozzle, a first chemical liquid and a first spray, the first spray including a first liquid dissolving the first chemical liquid; and
    moving the dual nozzle in a first direction while providing the first chemical liquid and the first spray to the substrate,
    wherein the dual nozzle comprises a first nozzle and a second nozzle,
    wherein the first nozzle supplies the first spray and the second nozzle supplies the first chemical liquid, and
    wherein the second nozzle follows behind the first nozzle along substantially the same locus as the first nozzle in the first direction while the dual nozzle provides the first chemical liquid and the first spray to the substrate.

16. The method of claim 15, wherein the first chemical liquid includes hydrofluoric acid.

17. The method of claim 15, wherein the first spray is supplied at a higher pressure than the first chemical liquid.

18. The method of claim 15, wherein the first chemical liquid includes hydrofluoric acid and the hydrofluoric acid has a weight percentage of 0.01 wt % to 2 wt % in relation to the first chemical liquid.

19. The method of claim 15, wherein the first direction is a circular movement direction.

20. The method of claim 15, wherein the first direction is a tangential direction of movement of the dual nozzle.

21. The method of claim 15, further comprising brushing a surface of the substrate and supplying a second chemical liquid onto the substrate while the brushing of the surface of the substrate is performed.

* * * * *